US009759418B2

(12) United States Patent
Nolan et al.

(10) Patent No.: US 9,759,418 B2
(45) Date of Patent: Sep. 12, 2017

(54) OPTICAL LENS STRUCTURES FOR LIGHT EMITTING DIODE (LED) ARRAY

(71) Applicant: Ephesus Lighting, Inc., Syracuse, NY (US)

(72) Inventors: Christopher D. Nolan, Syracuse, NY (US); Joseph R. Casper, Syracuse, NY (US); Walten Peter Owens, Syracuse, NY (US)

(73) Assignee: Ephesus Lighting, Inc., Syracuse, NY (US)

( * ) Notice: Subject to any disclaimer, the term of this patent is extended or adjusted under 35 U.S.C. 154(b) by 0 days.

(21) Appl. No.: 15/389,542

(22) Filed: Dec. 23, 2016

(65) Prior Publication Data

US 2017/0184299 A1 Jun. 29, 2017

Related U.S. Application Data

(60) Provisional application No. 62/271,536, filed on Dec. 28, 2015.

(51) Int. Cl.

| | |
|---|---|
| ***F21V 29/00*** | (2015.01) |
| ***F21V 31/00*** | (2006.01) |
| ***F21V 5/00*** | (2015.01) |
| ***F21V 17/06*** | (2006.01) |
| ***F21V 23/00*** | (2015.01) |
| ***F21V 29/70*** | (2015.01) |
| ***F21V 5/04*** | (2006.01) |

(Continued)

(52) U.S. Cl.
CPC ............ *F21V 31/005* (2013.01); *F21V 5/007* (2013.01); *F21V 5/04* (2013.01); *F21V 17/06* (2013.01); *F21V 17/164* (2013.01); *F21V 23/001* (2013.01); *F21V 29/70* (2015.01); *F21Y 2115/10* (2016.08)

(58) Field of Classification Search
CPC ........ F21V 31/005; F21V 5/007; F21V 17/06; F21V 23/001; F21V 29/70; F21V 5/04; F21V 17/164; F21Y 2115/10
USPC .......................................................... 362/267
See application file for complete search history.

(56) References Cited

U.S. PATENT DOCUMENTS

| | | |
|---|---|---|
| 2,254,962 A | 9/1941 | Bitner |
| 6,367,950 B1 | 4/2002 | Yamada et al. |

(Continued)

FOREIGN PATENT DOCUMENTS

| | | | | |
|---|---|---|---|---|
| EP | 1048085 A1 | | 11/2000 | |
| JP | 2005347279 A | * | 12/2005 | .............. F21V 5/007 |

OTHER PUBLICATIONS

U.S. Appl. No. 15/388,907 (Double Patenting Consideration).*

(Continued)

*Primary Examiner* — Anh Mai
*Assistant Examiner* — Hana Featherly
(74) *Attorney, Agent, or Firm* — Fox Rothschild LLP

(57) ABSTRACT

A light fixture includes one or more of light emitting diode (LED) modules. Each of the LED modules may include a substrate holding a plurality of LEDs, and a printed circuit board connected to the plurality of LEDs. Each of the LED modules may also include a flexible lens cover including a plurality of lenses, each positioned to be located over one of the LEDs. The flexible lens cover may include a side sealing structure configured to interface with the substrate and seal the lens cover to the substrate.

16 Claims, 9 Drawing Sheets

(51) Int. Cl.
*F21V 17/16* (2006.01)
*F21Y 115/10* (2016.01)

(56) References Cited

U.S. PATENT DOCUMENTS

| | | | |
|---|---|---|---|
| 6,547,423 | B2 | 4/2003 | Marshall et al. |
| 6,724,543 | B1 | 4/2004 | Chinniah et al. |
| D629,930 | S | 12/2010 | Cotter et al. |
| D656,664 | S | 3/2012 | Son |
| D661,822 | S | 6/2012 | Jeon et al. |
| D666,331 | S | 8/2012 | Chen |
| 8,274,220 | B2 | 9/2012 | Destain et al. |
| D687,986 | S | 8/2013 | Maxik et al. |
| 8,591,083 | B2 | 11/2013 | Koizumi et al. |
| D701,637 | S | 3/2014 | Xue et al. |
| D706,460 | S | 6/2014 | Lu |
| D709,642 | S | 7/2014 | Maxik et al. |
| D716,972 | S | 11/2014 | Yang et al. |
| D717,476 | S | 11/2014 | Xue et al. |
| D719,684 | S | 12/2014 | Grajcar |
| D733,352 | S | 6/2015 | Casper et al. |
| 2004/0240191 | A1* | 12/2004 | Arnold .................... H01L 23/04 361/800 |
| 2005/0179041 | A1 | 8/2005 | Harbers et al. |
| 2009/0251897 | A1 | 10/2009 | Kabuki et al. |
| 2012/0182743 | A1 | 7/2012 | Chou |
| 2013/0033881 | A1 | 2/2013 | Terazawa et al. |
| 2013/0077307 | A1 | 3/2013 | Yamamoto |
| 2013/0235581 | A1 | 9/2013 | Iatan |
| 2015/0054410 | A1 | 2/2015 | Sanders et al. |

OTHER PUBLICATIONS

U.S. Appl. No. 15/388,825 (Double Patenting Consideration).*
U.S. Appl. No. 15/388,760 (Double Patenting Consideration).*
U.S. Appl. No. 15/388,735 (Double Patenting Consideration).*
English Translation of JP 2005347279 A (Dec. 15, 2005).*

* cited by examiner

OPTICAL LENS STRUCTURES FOR LIGHT EMITTING DIODE (LED) ARRAY

RELATED APPLICATIONS AND CLAIM OF PRIORITY

This patent document claims priority to U.S. provisional patent application No. 62/271,536, filed Dec. 28, 2015, the disclosure of which is hereby incorporated by reference in full.

BACKGROUND

The advent of light emitting diode (LED) based luminaires has provided sports arenas, stadiums, other entertainment facilities, and other commercial and industrial facilities the ability to achieve instant on-off capabilities, intelligent controls and adjustability while delivering excellent light quality, consistent light output, and improved energy efficiency. Because of this, users continue to seek improvements in LED lighting devices. For example, new and improved ways to protect the luminaire from outdoor elements such as moisture and dirt are desired. If the luminaire unit is not waterproof, moisture will penetrate to reach the internal circuitry of the LED devices, and the luminaire unit will stop working. Current solutions require costly and time consuming steps of attaching a watertight seal using screws, adhesives, soldering, etc. and are not scalable may not be completely waterproof.

This document describes new illumination devices that are directed to solving the issues described above, and/or other problems.

SUMMARY

In an embodiment, a light fixture includes one or more light emitting diode (LED) modules. Each of the LED modules may include a substrate holding a plurality of LEDs. Each LED module also includes a circuit board connected to the plurality of LEDs. Each of the LED modules also includes a flexible lens cover including a plurality of lenses, each positioned to be located over one of the LEDs. The flexible lens cover may include a side sealing structure configured to interface with the substrate and seal the lens cover to the substrate.

The substrate of each LED module may include a ridge along each outer edge of the substrate, so that the ridge has a thickness that is less than a thickness of a portion of the substrate that holds the LEDs and the circuit board. The lens cover may include a lip configured to fit over the ridge. The ridge may include a groove positioned in a central area of the ridge, so that when pressure is applied to the flexible lens cover, the lens cover will at least partially fill the ridge to form a seal.

The side sealing structure of each LED module may include an indentation on the lens cover configured to mechanically interface with a counterpart on an edge of the circuit board.

Each LED module may include a female snap-fit indentation on the circuit board, such that the female snap-fit indentation mechanically interfaces with a male snap-fit counterpart on a lower end of the side sealing structure.

Each flexible lens structure may include lenses that are co-molded with, or otherwise attached to, the side sealing structure.

The side sealing structure may include one or more nub structures that provide a watertight seal of the lens cover to the substrate Each LED module may include conductive lines positioned over the substrate to provide a conductive path between each of the LEDs and a power source of the light fixture. In addition, a layer of electrically non-conductive, thermally conductive material may be positioned between the conductive lines and substrate so that, in operation, the LEDs and conductive lines are electrically separated from the substrate while heat from the LEDs passes through the layer to the substrate.

DETAILED DESCRIPTION

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

When used in this document, terms such as "top" and "bottom," "upper" and "lower", or "front" and "rear," are not intended to have absolute orientations but are instead intended to describe relative positions of various components with respect to each other. For example, a first component may be an "upper" component and a second component may be a "lower" component when a light fixture is oriented in a first direction. The relative orientations of the components may be reversed, or the components may be on the same plane, if the orientation of a light fixture that contains the components is changed. The claims are intended to include all orientations of a device containing such components.

As used in this document, the term "connected" means having a connected relationship, either directly or indirectly via one or more intermediary elements. A connection may be either a structural connection in which components are physically connected, or an electrical connection in which components are directly or indirectly connected so that power and/or control signals may pass between the components via one or more conductors.

Figure 1:
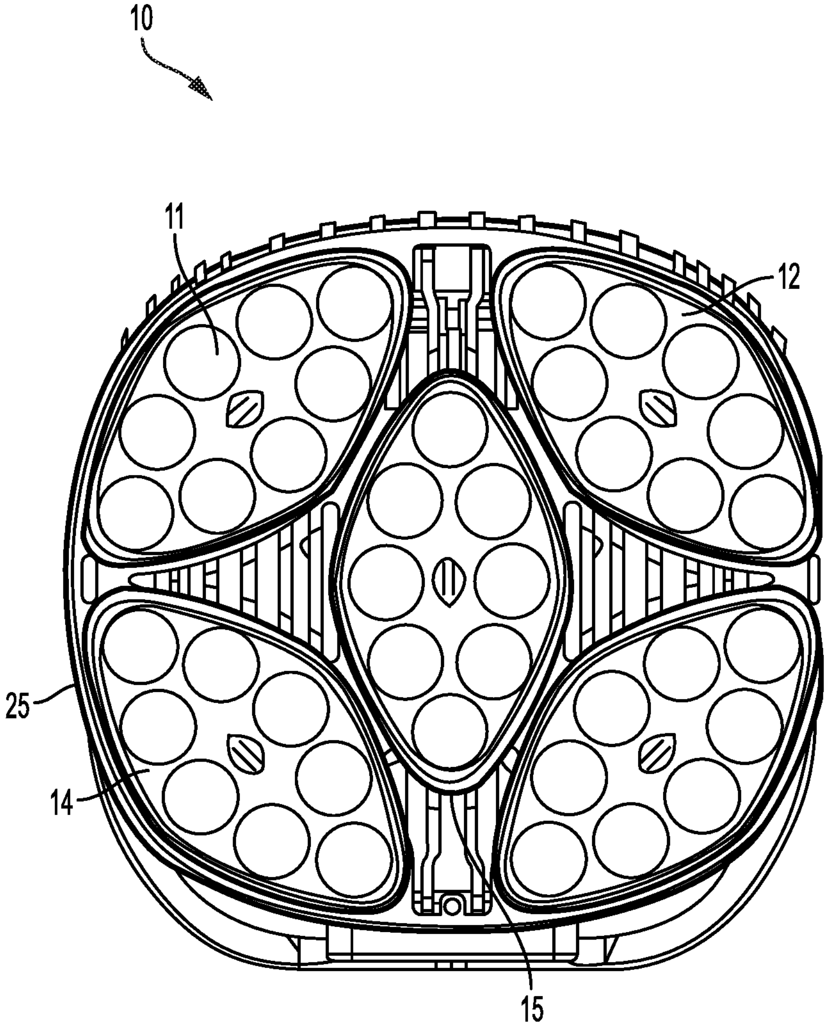
FIG. 1 illustrates a front view of an example of one embodiment of an illumination device that may incorporate LED modules such as those disclosed in this document.
Figure 2:
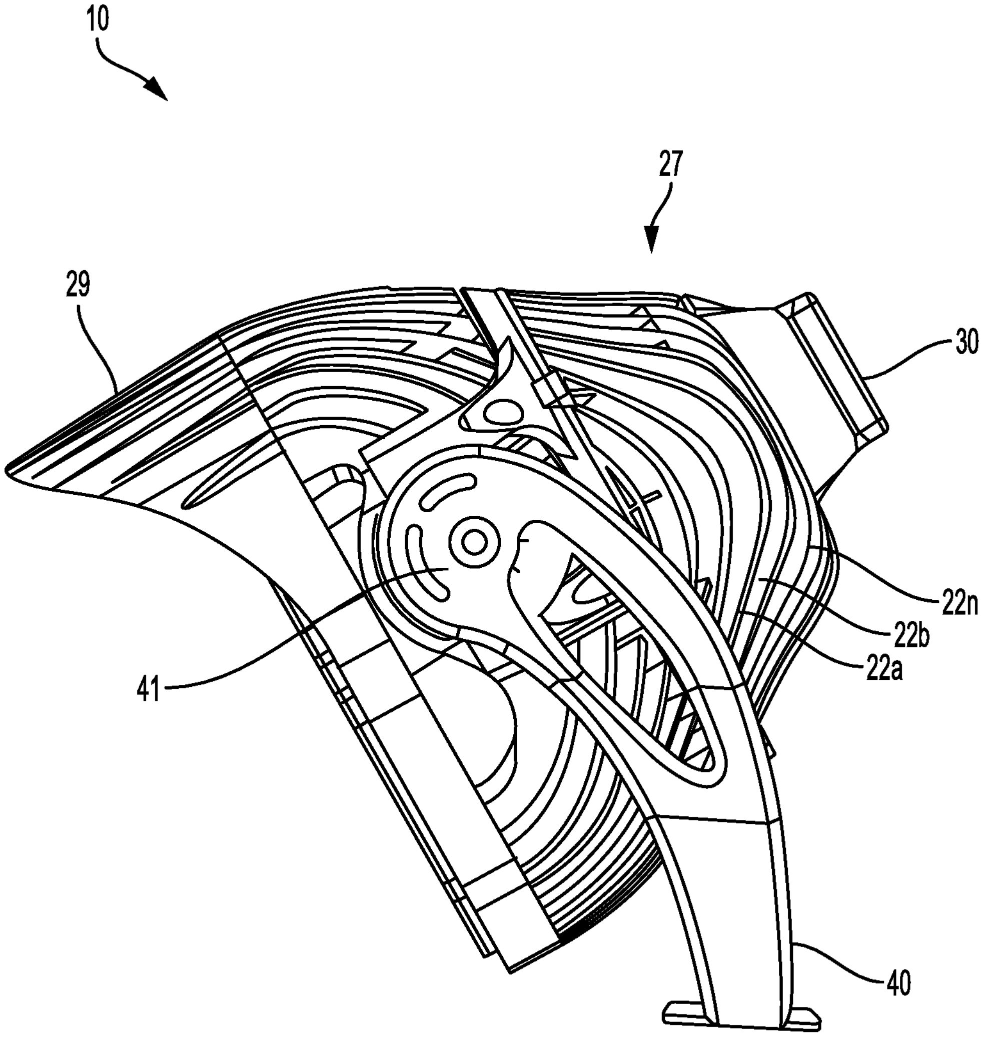
FIG. 2 illustrates a view from one side of the device of FIG. 1, according to an embodiment.

FIG. 1 illustrates a front view of an example of one embodiment of the illumination devices disclosed in this document. FIG. 2 illustrates a view from one side of the device of FIG. 1, while FIG. 2 provides a perspective view. The illumination device 10 includes a housing 25 that encases various components of a light fixture. As shown in FIG. 1, the housing 25 includes an opening in which a set of light emitting diode (LED) modules 11-15 are secured to form a multi-module LED structure. The LED modules 11-15 are positioned to emit light away from the fixture. Each LED module includes a frame that holds a set of LEDs arranged in an array or other configuration. In various embodiments the number of LEDs in each module may be any number that is sufficient to provide a high intensity LED device. Each LED module will also include a substrate on which the LEDs, various conductors and/or electronic devices, and lenses for the LEDs are mounted.

The opening of the housing 25 may be circular, square, or a square with round corners as shown in FIG. 1, although other shapes are possible. The LED modules 11-15 may include five modules as shown, with four of the modules 11-14 positioned in a quadrant of the opening and the fifth module 15 positioned in the center as shown. Alternatively, any other number of LED modules, such as one, two, three, four or more LED modules, may be positioned within the opening in any configuration.

The device's housing 25 includes a body portion 27 and an optional shroud portion 29. The body portion 27 serves as a heat sink that dissipates heat that is generated by the LED modules. The body/heat sink 27 may be formed of aluminum and/or other metal, plastic or other material, and it may include any number of fins 22*a* . . . 22*n* on the exterior to increase its surface area that will contact a surrounding cooling medium (typically, air). Thus, the body portion 27 or the entire housing 25 may have a bowl shape as shown, the LED modules 11-15 may fit within the opening of the bowl, and heat from the LED modules 11-15 may be drawn away from the LED modules and dissipated via the fins 22*a* . . . 22*n* on the exterior of the bowl.

While the LED modules are positioned at the front of body portion 27, the opposing side of the body portion may be attached to a power supply unit 30, optionally via a thermal interface plate. The power supply unit 30 may include a battery, solar panel, or circuitry to receive power from an external and/or other internal source. A power supply unit 30 may be positioned at the rear of the body (i.e., at the bottom of the bowl), and the interior of the unit may include wiring or other conductive elements to transfer power and/or control signals from the power supply unit 31 to the LED modules 11-15. The power supply unit 30 may be positioned at or near the rear of the body as shown, or it may be placed into the housing so that it is flush or substantially flush with the rear of the body 27, or it may be configured to extend to some point between being flush with the body portion 27 and an extended position. A sensor cavity 32 may be attached to the power supply and/or other part of the device as shown, and it may contain sensors and/or control and communications hardware for sensing parameters of and controlling the device, receiving commands, and transmitting data to remote control devices.

The housing 25 may be formed as a single piece, or it may be formed of two pieces that fit together as in a clamshell-type structure. In a clamshell design, a portion of the interior wall of the clamshell near its opening may include a groove, ridge, or other supporting structure that is configured to receive and secure the LED structure in the opening when the clamshell is closed. In addition, the fins 22*a* . . . 22*n* may be curved or arced as shown, with the base of each fin's curve/arc positioned proximate the opening/LED modules, and the apex of each fin's curve/arc positioned distal from the opening/LED modules to further help draw heat away from the LED modules. The housing may be attached to a support structure 40, such as a base or mounting yoke, optionally by one or more connectors 41. As shown, the connectors 41 may include axles about which the housing and/or support structure may be rotated to enable the light assembly to be positioned to direct light at a desired angle.

The power supply unit 30 may be detachable from remainder of the lighting device's housing 25 so that it can be replaced and/or removed for maintenance without the need to remove the entire device from an installed location, or so that it can be remotely mounted to reduce weight. The power supply unit 30 and/or a portion of the lighting unit housing 25 may include one or more antennae, transceivers or other communication devices that can receive control signals from an external source. For example, the illumination device may include a wireless receiver and an antenna that is configured to receive control signals via a wireless communication protocol. Optionally, a portion of the lighting unit housing 25 or shroud 29 (described below) may be equipped with an attached laser pointer that can be used to identify a distal point in an environment to which the lighting device directs its light. The laser pointer can thus help with installation and alignment of the device to a desired focal point.

FIGS. 1 and 2 show that the device may include a shroud 29 that protects and shields the LED modules 11-15 from falling rain and debris, and that may help direct light toward an intended illumination surface. The shroud 29 may have any suitable width so that an upper portion positioned at the top of the housing is wider than a lower portion positioned at the bottom and/or along the sides of the opening of the housing. This may help to reduce the amount of light wasted to the atmosphere by reflecting and redirecting stray light downward to the intended illumination surface. FIG. 2 illustrates that in an embodiment, some or all of the fins of the housing 22*a*-22*n* may be contiguous with fin portions 23*a*-23*n* that extend across the shroud 29. With this option, the shroud 29 can also serve as part of the heat sink.

The fins 22*a* . . . 22*n* may be positioned substantially vertically (i.e., lengthwise from a top portion of the LED array structure and shroud 29 to a bottom portion of the same). Optionally, one or more lateral supports may be interconnected with the fins to provide support to the housing. The lateral supports may be positioned substantially parallel to the axis of the fins, or they may be curved to extend away from the LED structure, or they may be formed of any suitable shape and placed in any position. Each support may connect two or more of the fins. The fins and optional supports form the body portion 27 as a grate, and hot air may rise through the spaces that exist between the fins and supports of the grate. In addition, precipitation may freely fall through the openings of the grate. In addition, any small debris (such dust or bird droppings) that is caught in the grate may be washed away when precipitation next occurs.

Figure 3:
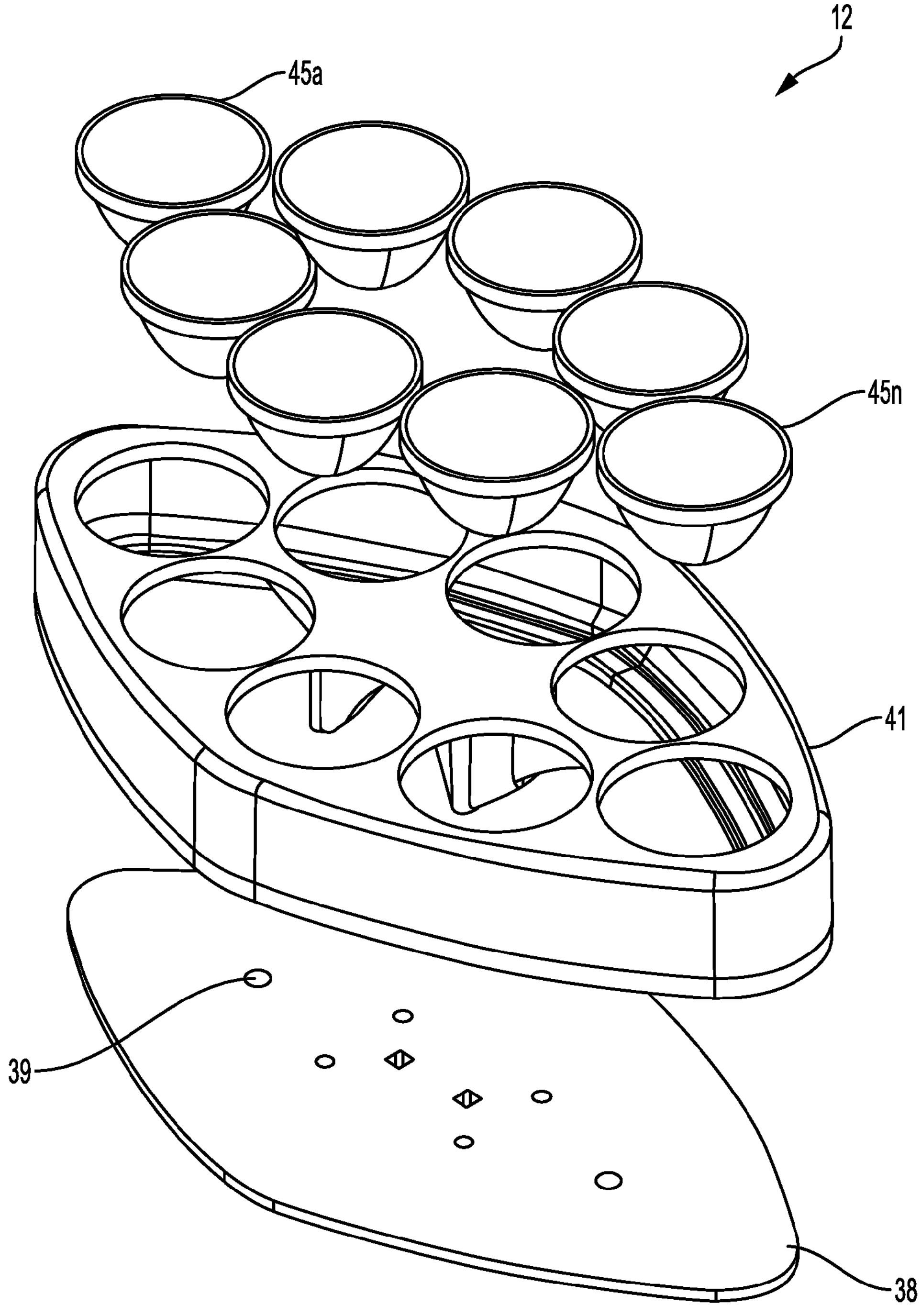
FIG. 3 illustrates an expanded view of an example of an LED module, according to an embodiment.

FIG. 3 illustrates an embodiment of the device, with an expanded view of an LED module 12. As shown, the LED module 12 includes a substrate 38 on which a number of LEDs 39 are positioned, directly or via one or more intervening layers. The LEDs 39 may be arranged in one or more rows, matrices, or other arrangements with corresponding components supported in place and/or spaced apart by supports. For example, the LEDs may form matrices of n×n LEDs, such as 4×4 or 8×8 matrices. Alternatively, the LEDs in each module 12 may be positioned in curved rows so that when all modules are positioned within the opening, the LED structure comprises concentric rings of LEDs. The grouping of LEDs for the purpose of power supply and control may or may not conform to the arrangement of the LEDs in rings, clusters, matrices or other groupings. The substrate may include a portion that is a circuit board. Driver circuitry on the circuit board may deliver current to the LEDs via one or more conductors on the substrate, such as conductive lines, traces or wires positioned on the substrate. The conductive lines may be copper, silver or another conductive material and applied as conductive ink, wire, traces, or other materials to provide a conductive pathway. The LED array modules may include multi-wire connectors with prongs and/or receptacles for connecting to external conductors and/or signal wires, or other LED array modules.

A lens cover 41 may be positioned over the substrate 38 to protect the substrate 38 and LEDs 39 from the ambient elements, as well as to focus and/or direct light emitted by the LEDs 39. FIG. 3 shows that the lens cover 41 includes a set of lenses 45*a* . . . 45*n*, each of which is positioned to fit over a corresponding LED that is positioned on the substrate. The LEDs, and thus lenses, may form an array. Optionally, more than one LED may share a lens. The spacing of LEDs (and thus the lenses) with respect to each other may vary based on the size of the LEDs. As shown in FIG. 3, each lens 45*a* . . . 45*n* may be dome-shaped, with the apex of each dome being flat or concave to receive light from the corresponding LED, and the larger part of each dome being positioned on the outer side the cover to direct the light. The standoff and slope of each dome may vary depending on the desired beam angle that is to be achieved by the lighting device. For example, a lighting system may be provided with domes of at least six different shapes to correspond to various beam limiting (collimating) standards.

In an embodiment, the lenses 45*a* . . . 45*n* may be identical as shown in FIG. 3. Alternatively, one or more of the lenses may have a different size, shape or orientation as compared to the other lenses. Optionally, the lenses may include features such as those disclosed in U.S. Patent Application Pub. No. 2014/0334149 filed by Nolan et al or U.S. Patent Application Pub. No. 2015/0167922 filed by Casper et al., the disclosures of which are fully incorporated herein by reference. Other lens structure are possible. The lenses may be formed to be integral with the lens cover (such as in a co-molding process), or they may be separately formed and inserted into openings of the lens cover, in which the attachment may be a snap-fit process, a thermal sealing process, or another connection process. The outer walls of any or all of the lenses may be textured or smooth, depending on the characteristics of the mold that is used to form the lenses.

Figure 3A:
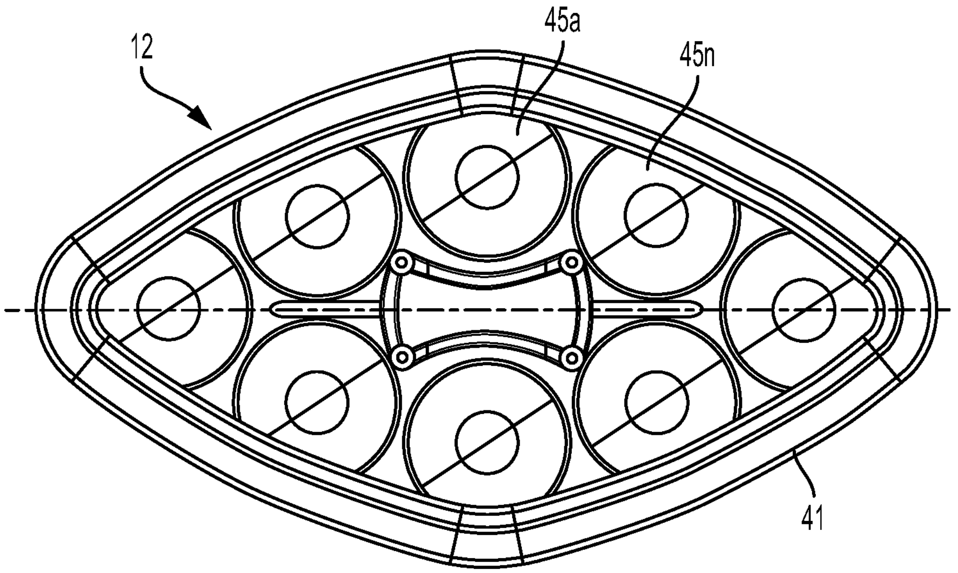
FIG. 3A illustrates a top perspective view of the module of FIG. 3, according to an embodiment.

FIG. 3A is a top perspective view of the LED module 12 formed by a group of the lenses 45*a* . . . 45*n* molded into a lens cover 41.

Figure 3B:
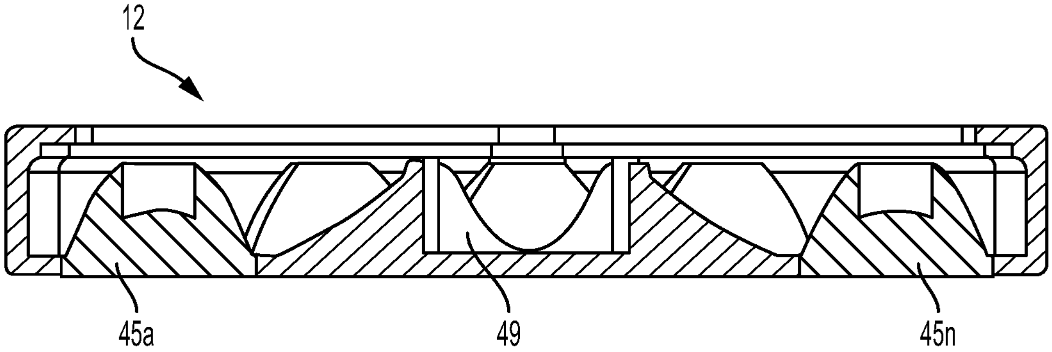
FIG. 3B illustrates a bottom perspective view of the module of FIG. 3, according to an embodiment.

FIG. 3B is a bottom perspective view of the LED module 12 (without the substrate) formed by a group of the lenses 45*a* . . . 45*n* molded into a lens cover 41. The lens cover may extend down along the sides and may include a lower extension with one or more nub structures (not shown here). In an embodiment, the group of lenses 45*a* . . . 45*n* may be connected by a connecting structure 49 that may serve as a support that holds the lenses together.

Figure 4:
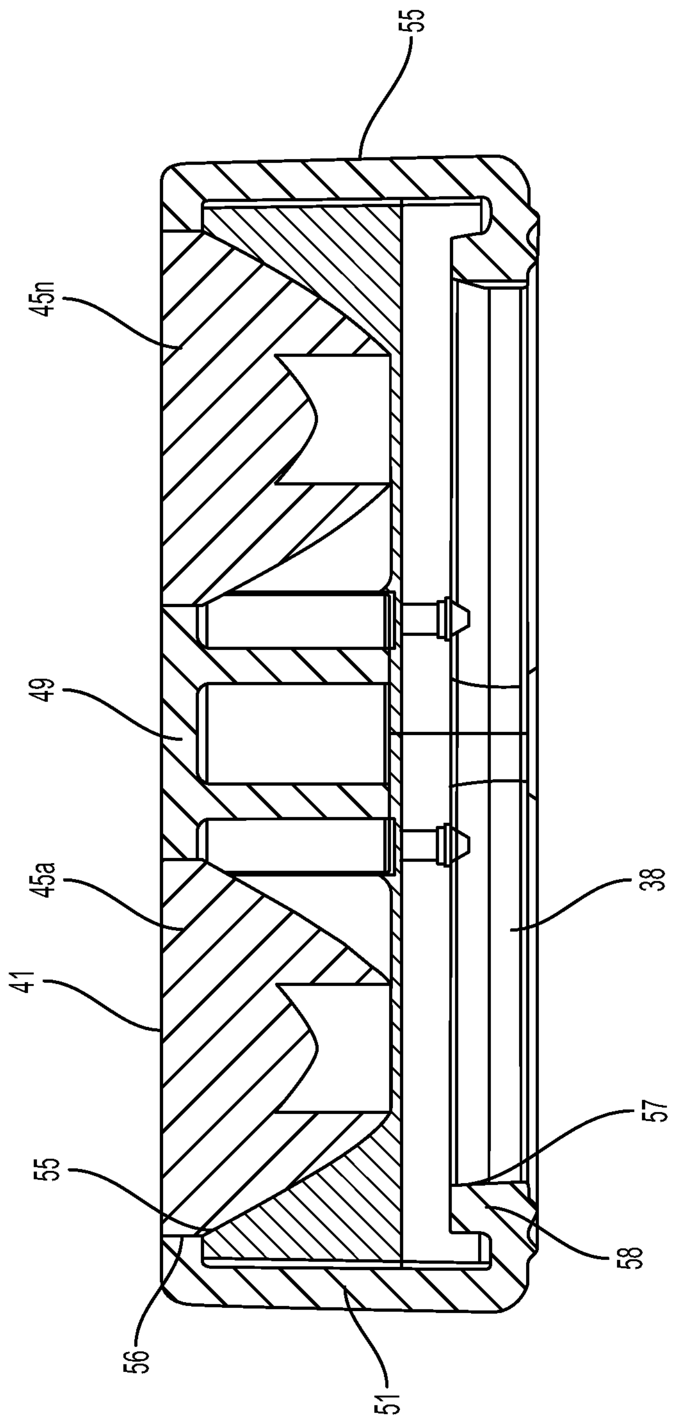
FIG. 4 illustrates a cross-sectional view of the module of FIG. 3, according to an embodiment.

FIG. 4 is a side cross-sectional view of one embodiment showing how a group of the lenses may be molded into a lens cover 41 (includes a set of lenses 45*a* . . . 45*n*) such as the one of FIG. 3. As discussed above, the lens cover 41 may be positioned over the substrate 38 and LEDs 39, where the substrate 38 may include a portion that is a printed circuit board. The group of lenses 45*a* . . . 45*n* are connected by a connecting structure 49 that serves as a support that holds the lenses together. The connecting structure 49 may fill in all open areas between the lenses, or it may be in the form of a web with a group of lateral supports that interconnect the lenses as shown in FIG. 4A. The connecting structure 49 only needs to connect to an upper portion of each lens such as the upper rim of the lens cover.

In this embodimemt, a side sealing structure 51 that is separate from the lens cover 41 is illustrated. In an embodiment, the rim of the lens cover 41 may include a female snap-fit indentation 55 to receive an upper male snap-fit counterpart 56 of the side sealing structure 51 to form a tight seal on the upper end of the side sealing structure. Additionally and/or optionally, the female snap-fit indentation 55 may be formed on the connecting structure 49 (not shown here). In an embodiment, the rim of the substrate 38 and/or the printed circuit board may include a female snap-fit indentation 57 to receive a lower male snap-fit counterpart 58 of the side sealing structure 51 to form a tight seal on the lower end of the side sealing structure. In an embodiment, the female snap-fit indentation may be a groove, a notch, a lip or the like. In an embodiment, the male snap-fit counterparts of a sealing structure 51 may be a protrusion such as L-shaped, U-shaped, C-shaped, or the like. In an embodiment, the side sealing structure 51 may also include one or more nub structures (not shown), which when pressed may push the lower counterpart 58 of the side sealing structure 51 into the indentation 58 to create a watertight seal.

Hence, the side sealing structure 51 may stretch from the top rim of the lens cover 41 and snap into place under the substrate 53 to form a watertight seal all around the LED module. The side sealing structure 51 does not need any additional screws, nuts, bolts, adhesives, etc. to provide a waterproof seal and can be easily assembled into place. Further, the side sealing structure 51 may have a geometry that is the same as or similar to the LED module's side surface geometry such that the side sealing structure 51 fits snugly when attached.

It will be understood to those skilled in the art, that while the current disclosure provides a snap-fit mechanism as an example for securing the side sealing structure 51 from the upper lens cover 52 to the lower substrate 53, without screws, bolts, nuts, etc., other mechanisms are within the scope of this disclosure. Examples may include, without limitation, friction fit, interference fit, press fit, mechanical coupling, or the like, via snapping, fastening, clamping, clasping, clipping, hooking, pushing, attaching, and/or securing the upper and/or lower extensions of the side sealing structure.

In an embodiment, the lens cover 41 and the lenses 45*a* . . . 45*n* may be co-molded together to further provide a sealed LED module 12 to protect the LEDs from outside environmental conditions such as dust and rain. In an embodiment, the lens cover 41, the side sealing structure 51 (is not part of the lens cover 41), and the lenses 45*a* . . . 45*n* may be co-molded together to further provide a sealed LED module to protect the LEDs from outside environmental conditions such as dust and rain. Any now or hereafter known co-molding methods may be used for making the sealed LED module.

Figure 5A:
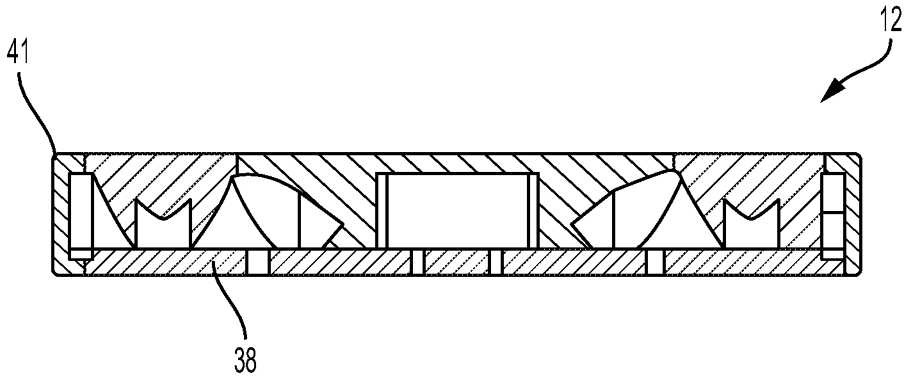
FIG. 5A illustrates a cross-sectional view of the module of FIG. 3, according to an alternate embodiment.
Figure 5B:
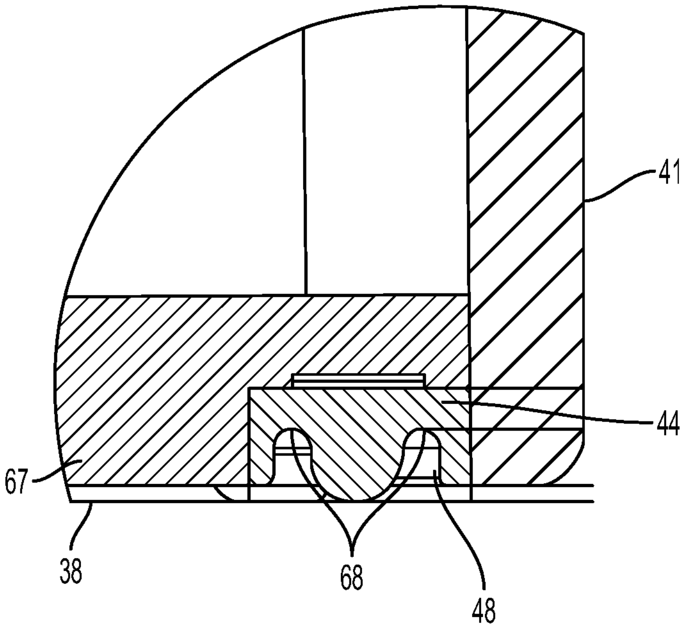
FIG. 5B illustrates a close-up view of a portion of the structure shown in FIG. 5A, according to an embodiment.

FIGS. 5A and 5B illustrate a side cross-sectional view of an alternate embodiment showing how a group of the lenses may be molded into a lens cover 41. As shown in FIGS. 5A and 5B (in which FIG. 5B is a close-up view of a bottom corner of the structure shown in FIG. 5A), the interconnected group of LEDs may include a side sealing structure that may extend all around the lateral sides of an LED module to form a waterproof seal. The side sealing structure protects the LEDs under the lens cover 41 from outside environmental conditions such as dust and rain. In an embodiment, the lens cover 41 and/or the connecting structure 49 may be flexible and may extend down along the sides such that the side sealing structure is a part of the lens cover 41 and/or the connecting structure 49. In this assembly, an upper counterpart (as discussed below for FIG. 6) is not required, and a lower extension 44 of the lens cover 41 and/or the connecting structure 49 may form a watertight seal around the substrate 38 and/or the printed circuit board. In an embodiment, the flexible lens cover 41 may be formed from materials such as optical silicone, polycarbonate, or the like.

In an embodiment, the substrate 38, may include a ridge 67 for receiving a lower extension 44 (or lip) of the lens cover 41. As shown in FIG. 5A, and FIG. 5B, in an example embodiment, ridge 67 may be formed when a part, along the rim of the substrate 38, has a thickness that is less than that of the substrate that holds the LEDs and/or the printed circuit board. A surface of the ridge 67 that comes in contact with the lens cover 41 may include one or more grooves 68. In an embodiment, the outer surface of the lower extension 44 may also include one or more nub structures and/or protrusions 48, such that when pressure is applied to the lower extension 44, via the nub structures 48, the lower extension 44 fits into the ridge 67, via the grooves 68, to form a watertight seal. In an embodiment, the nub structures 48 may also act as pressure release tabs. FIG. 5A illustrates the side views of the substrate 38 showing the ridge 67 along the rim of the substrate having a thickness that is less than that of the substrate that holds the LEDs and/or the printed circuit board. FIG. 5B illustrates a side perspective view of the substrate in which the ridge 67 and the grooves 68 are shown.

In an embodiment, the lens cover 41 and the lenses 45*a* . . . 45*n* may be co-molded together to further provide a sealed LED module 12 to protect the LEDs from outside environmental conditions such as dust and rain.

Figure 6:
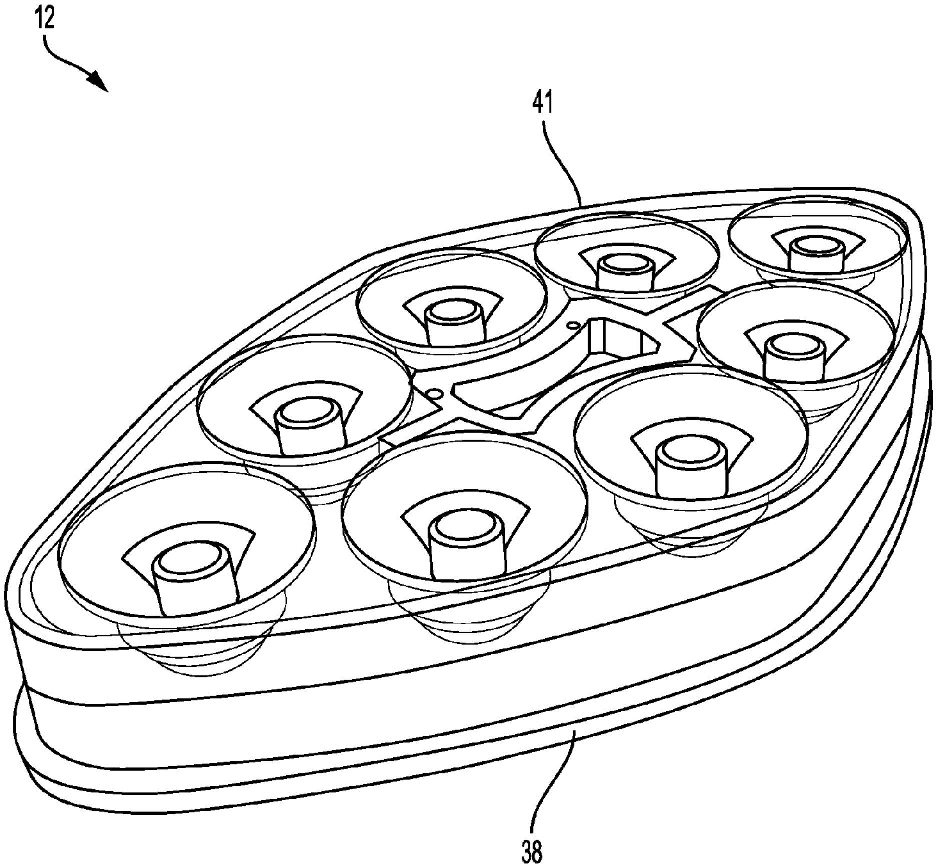
FIG. 6 is a side cross-sectional view of the module of FIG. 3, according to an embodiment.

Additionally and/or optionally, FIG. 6 is a side cross-sectional view of the LED module shown in FIG. 3

In an embodiment, the side sealing structure of FIG. 4 and/or the lens cover of FIGS. 5A and 5B may be formed from an opaque material to prevent off-angle glare and/or collimate light within the LED module. For example, the side sealing structure may be made from a flexible material such as optical silicone with the desired opacity value, polycarbonate with desired opacity value, or other similar materials known to those skilled in the art.

Figure 7:
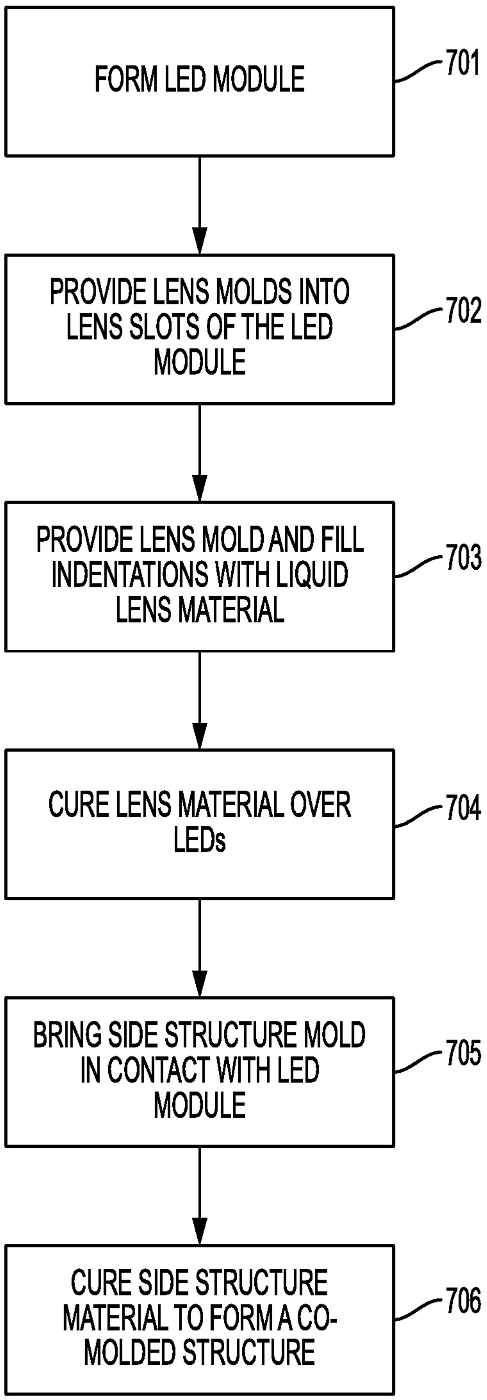
FIG. 7 illustrates an example flowchart method for forming the module of FIG. 3, according to an embodiment.

FIG. 7 illustrates an example flowchart method for forming the module of FIG. 3, according to an embodiment. The method may include forming an LED module structure (step 701) and providing lens molds into lens slots of the LED module structure (step 702). In an embodiment, the LED module structure may be formed from materials such as optical silicone, polycarbonate, or the like, using techniques known to those skilled in the art. The LED module and lens mold are formed to have structures as discussed above. Liquid lens material may then be filled into the lens molds (step 703) and cured (step 704) using now or hereafter known techniques. A side structure mold to form the side sealing structure according to the embodiments shown in FIG. 4 or FIG. 5A is contacted with the LED module (step 705) and cured (step 706) to form a co-molded structure. Any now or hereafter known co-molding methods may be used for making the sealed lens module.

Figure 8:
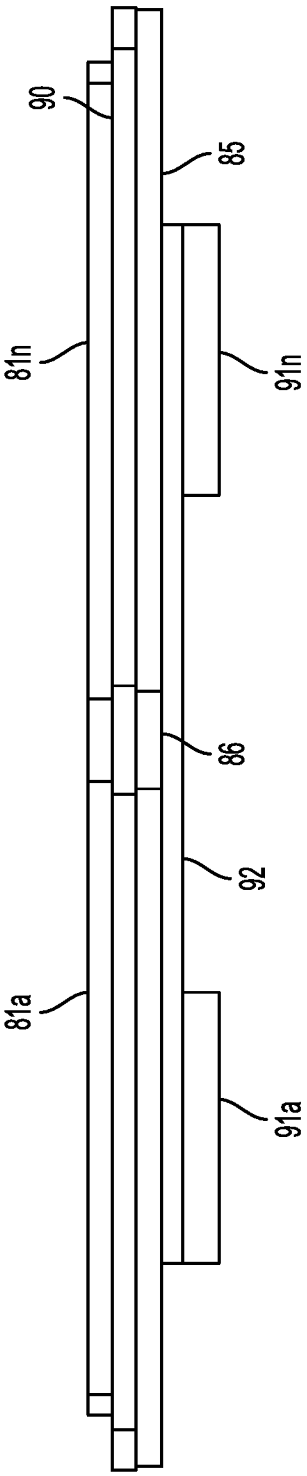
FIG. 8 illustrates a side view of the LED module's substrate with optional layers between the substrate and the module's LEDs.

FIG. 8 illustrates that in some embodiments, additional layers may be provided on a side of the substrate to facilitate heat dissipation from the LEDs and/or other desirable properties. For example, as shown in FIG. 8 a substrate 90 made of aluminum or another suitable material may have pressure multiplying pads 81*a* . . . 81*n* positioned on one side of the substrate. The opposite side of the substrate 95 may be partially or fully coated with a dielectric layer 85 of material that electrically separates conductive lines 92 from the substrate 90. The conductive lines 92 may deliver power to the LEDs 91*a* . . . 91*n* from a power source. The dielectric layer 85 provides electric isolation under the LEDs but allows heat to pass from the LEDs 91*a* . . . 91*n* to the substrate 90 (and thus to the heat sink). Example electrically non-conductive/thermally conductive materials include aluminum nitride, beryllium oxide, alumina, silicon and ceramic materials. Optionally, the electrically non-conductive/thermally conductive layer 85 may be applied to the whole substrate 90, or it may be selectively applied to be positioned under the LEDs, while leaving spaces open in at least some areas 86 of the substrate on which LEDs are not positioned.

Optionally, the substrate and other portions of the LED module may be coated with a conformal coating to provide environmental protection for the module while limiting thermal resistance between the LED module and the heat sink. The coating may comprise parylene, silicone, polyurethane, acrylic or another material be applied by chemical vapor deposition or any other suitable application process. Suitable coatings and materials are described in, for example: U.S. Patent Application Pub. No. 2009014227 to Fuchs et al., or U.S. Pat. No. 6,389,690 to McCullough et al. (The disclosures of each document listed in the previous sentence are fully incorporated herein by reference.) The coating may be applied to all of the exterior of the LED module (i.e., over the top, bottom and sides) after the LEDs and conductive lines are applied to the substrate, or it may be selectively applied to various portions of the LED module.

It is intended that the portions of this disclosure describing LED modules are not limited to the embodiment of the illumination devices disclosed in this document. The LED modules may be applied to other LED illumination structures, such as those disclosed in U.S. Patent Application Pub. No. 2014/0334149 (filed by Nolan et al. and published Nov. 13, 2014), and in U.S. Patent Application Pub. No., 2015/0167937 (filed by Casper et al. and published Jun. 18, 2015), the disclosures of which are fully incorporated herein by reference.

The features and functions described above, as well as alternatives, may be combined into many other systems or applications. Various presently unforeseen or unanticipated alternatives, modifications, variations or improvements may be made by those skilled in the art, each of which is also intended to be encompassed by the disclosed embodiments.

The invention claimed is:

1. A light emitting diode (LED) module for an illumination device, the LED module comprising: a substrate holding a plurality of LEDs; a circuit board connected to the LEDs; and a flexible lens cover comprising a plurality of lenses, each positioned to be located over one of the LEDs;

wherein the flexible lens cover comprises a side sealing structure configured to interface with the substrate and seal the lens cover to the substrate; wherein the substrate comprises a ridge along each outer edge of the substrate, so that the ridge has a thickness that is less than a thickness of a portion of the substrate that holds the LEDs and the circuit board; and the flexible lens cover comprises a lip configured to fit over the ridge.

2. The LED module of claim 1, wherein the ridge comprises a groove positioned in a central area of the ridge, so that when pressure is applied to the flexible lens cover, the lens cover will at least partially fill the groove to form a seal.

3. The LED module of claim 1, wherein the side sealing structure comprises an indentation on the lens cover configured to mechanically interface with a counterpart on an edge of the circuit board.

4. The LED module of claim 1, wherein the circuit board comprises a female snap-fit indentation that is mechanically interfaced with a male snap-fit counterpart on a lower end of the side sealing structure.

5. The light fixture of claim 1, wherein the flexible lens structure comprises a plurality of lenses that are co-molded with the side sealing structure.

6. The LED module of claim 1, wherein the side sealing structure comprises one or more nub structures that provide a watertight seal of the lens cover to the substrate.

7. The LED module of claim 1, further comprising a plurality of conductive lines positioned over the substrate to provide a conductive path between each of the LEDs and a power source.

8. The LED module of claim 7, further comprising a layer of electrically non-conductive, thermally conductive material positioned between the conductive lines and substrate so that, in operation, the LEDs and conductive lines are electrically separated from the substrate while heat from the LEDs passes through the layer to the substrate.

9. An illumination device, comprising: a body portion that provides a heat sink; a power supply unit; and an opening that receives a plurality of LED modules in the body portion, wherein each of the LED modules comprises: a substrate holding a plurality of LEDs, a circuit board connected to the LEDs, and a flexible lens cover comprising a plurality of lenses, each positioned to be located over one of the LEDs; wherein the flexible lens cover of each LED module comprises a side sealing structure configured to interface with the substrate of the LED module and seal the lens cover to the substrate of the LED module; wherein, for each of the LED modules: the substrate comprises a ridge along each outer edge of the substrate, so that the ridge has a thickness that is less than a thickness of a portion of the substrate that holds the LEDs and the circuit board; and the flexible lens cover comprises a lip configured to fit over the ridge.

10. The illumination device of claim 9, wherein, for each of the LED modules:

the ridge comprises a groove positioned in a central area of the ridge, so that when pressure is applied to the flexible lens cover, the lens cover will at least partially fill the ridge to form a seal.

11. The illumination device of claim 9, wherein, for each of the LED modules, the side sealing structure comprises an indentation on the lens cover configured to mechanically interface with a counterpart on an edge of the circuit board.

12. The illumination device of claim 9, wherein, for each of the LED modules, the circuit board comprises a female snap-fit indentation mechanically interfaced with a male snap-fit counterpart on a lower end of the side sealing structure.

13. The illumination device of claim 9, wherein, for each of the LED modules, the flexible lens structure comprises a plurality of lenses that are co-molded with the side sealing structure.

14. The illumination device of claim 9, wherein, for each of the LED modules, the side sealing structure comprises one or more nub structures that provide a watertight seal of the lens cover to the substrate.

15. The illumination device of claim 9, wherein each of the LED modules further comprises a plurality of conductive lines positioned over the substrate to provide a conductive path for connecting each of the LEDs to the power supply unit.

16. The illumination device of claim 15, wherein each of the LED modules further comprises a layer of electrically non-conductive, thermally conductive material positioned between the conductive lines and the substrate so that, in operation, the LEDs and conductive lines are electrically separated from the substrate while heat from the LEDs passes through the layer to the substrate.

* * * * *